(12) United States Patent
Su et al.

(10) Patent No.: US 9,356,150 B2
(45) Date of Patent: May 31, 2016

(54) METHOD FOR INCORPORATING IMPURITY ELEMENT IN EPI SILICON PROCESS

(71) Applicant: TAIWAN SEMICONDUCTOR MANUFACTURING COMPANY, LTD., Hsin-Chu (TW)

(72) Inventors: Chien-Chang Su, Kaohsiung (TW); Hsien-Hsin Lin, Hsin-Chu (TW); Tsz-Mei Kwok, Hsinchu (TW); Kuan-Yu Chen, Taipei (TW); Hsueh-Chang Sung, Zhubei (TW); Yi-Fang Pai, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/833,259

(22) Filed: Aug. 24, 2015

(65) Prior Publication Data
US 2015/0364604 A1 Dec. 17, 2015

Related U.S. Application Data

(63) Continuation of application No. 12/644,869, filed on Dec. 22, 2009, now Pat. No. 9,117,905.

(51) Int. Cl.
*H01L 21/8234* (2006.01)
*H01L 29/78* (2006.01)
*H01L 21/02* (2006.01)
*H01L 29/66* (2006.01)
*H01L 29/06* (2006.01)
*H01L 29/167* (2006.01)

(52) U.S. Cl.
CPC ........ *H01L 29/7851* (2013.01); *H01L 21/0262* (2013.01); *H01L 21/02532* (2013.01); *H01L 21/02573* (2013.01); *H01L 21/02576* (2013.01); *H01L 29/0653* (2013.01); *H01L 29/167* (2013.01); *H01L 29/66795* (2013.01); *H01L 29/785* (2013.01); *H01L 29/7848* (2013.01)

(58) Field of Classification Search
CPC ............ H01L 29/66795; H01L 29/785; H01L 29/823821; H01L 29/823807
See application file for complete search history.

(56) References Cited

U.S. PATENT DOCUMENTS

| | | |
|---|---|---|
| 5,273,609 A | 12/1993 | Moslehi |
| 6,706,571 B1 | 3/2004 | Yu et al. |
| 6,858,478 B2 | 2/2005 | Chau et al. |

(Continued)

OTHER PUBLICATIONS

Bartlomiej Jan Pawiak, et al., U.S. Appl. No. 12/569,689, "Method of Fabricating Finfet Device," filed Sep. 29, 2009, 21 pages.

(Continued)

*Primary Examiner* — Whitney T Moore
*Assistant Examiner* — Joseph Galvin, III
(74) *Attorney, Agent, or Firm* — Haynes and Boone, LLP

(57) ABSTRACT

The present disclosure provides a method of fabricating a semiconductor device that includes forming a plurality of fins, the fins being isolated from each other by an isolation structure, forming a gate structure over a portion of each fin; forming spacers on sidewalls of the gate structure, respectively, etching a remaining portion of each fin thereby forming a recess, epitaxially growing silicon to fill the recess including incorporating an impurity element selected from the group consisting of germanium (Ge), indium (In), and carbon (C), and doping the silicon epi with an n-type dopant.

20 Claims, 8 Drawing Sheets

(56) References Cited

U.S. PATENT DOCUMENTS

| | | | |
|---|---|---|---|
| 7,190,050 | B2 | 3/2007 | King et al. |
| 7,247,887 | B2 | 7/2007 | King et al. |
| 7,265,008 | B2 | 9/2007 | King et al. |
| 7,508,031 | B2 | 3/2009 | Liu et al. |
| 7,528,465 | B2 | 5/2009 | King et al. |
| 7,605,449 | B2 | 10/2009 | Liu et al. |
| 2001/0045604 | A1 | 11/2001 | Oda et al. |
| 2005/0112817 | A1 | 5/2005 | Cheng et al. |
| 2005/0153490 | A1 | 7/2005 | Yoon et al. |
| 2006/0240630 | A1* | 10/2006 | Bauer .................. C23C 16/04 438/301 |
| 2007/0082451 | A1* | 4/2007 | Samoilov ........... H01L 21/0245 438/301 |
| 2007/0120156 | A1 | 5/2007 | Liu et al. |
| 2007/0122953 | A1 | 5/2007 | Liu et al. |
| 2007/0122954 | A1* | 5/2007 | Liu .................. H01L 27/0207 438/187 |
| 2007/0128782 | A1 | 6/2007 | Liu et al. |
| 2007/0132053 | A1 | 6/2007 | King et al. |
| 2007/0228372 | A1 | 10/2007 | Yang et al. |
| 2008/0067557 | A1* | 3/2008 | Yu .................... H01L 29/045 257/255 |
| 2008/0246057 | A1 | 10/2008 | Lin et al. |
| 2008/0258228 | A1 | 10/2008 | Chuang et al. |
| 2008/0263492 | A1 | 10/2008 | Chuang et al. |
| 2008/0280406 | A1 | 11/2008 | Ema et al. |
| 2008/0290470 | A1 | 11/2008 | King et al. |
| 2008/0296632 | A1 | 12/2008 | Moroz et al. |
| 2009/0035909 | A1 | 2/2009 | Chang et al. |
| 2009/0181477 | A1 | 7/2009 | King et al. |
| 2010/0006945 | A1 | 1/2010 | Merelle et al. |
| 2010/0006974 | A1 | 1/2010 | Xu et al. |
| 2010/0052059 | A1 | 3/2010 | Lee |
| 2010/0183961 | A1 | 7/2010 | Shieh et al. |
| 2010/0203734 | A1 | 8/2010 | Shieh et al. |
| 2010/0264468 | A1 | 10/2010 | Xu |
| 2011/0147846 | A1 | 6/2011 | Su et al. |

OTHER PUBLICATIONS

Hsien-Hsin Lin, et al., U.S. Appl. No. 12/703,918, "Method for Fabricating A Finfet Device," filed Feb. 11, 2010, 40 pages.

Tsung-Lin Lee, et al., U.S. Appl. No. 12/622,038, "Sacrificial Offset Protection Film For A Finfet Device," filed Nov. 19, 2009, 56 pages.

Jeff J. Xu, et al., U.S. Appl. No. 12/784,207, "Method of Forming EPI Film in Subsrate Trench," filed May 20, 2010, 33 pages.

Tian-Choy, et al., U.S. Appl. No. 12/756,552, "Hybrid Gate Process For Fabricating Finfet Device," filed Apr. 8, 2010, 38 pages.

Ming-Lung Cheng. et al. U.S. Appl. No. 12/780,124, "Method And Apparatus For Enhancing Channel Strain," filed May 14, 2010, 35 pages.

Jhon Jhy Liaw, U.S. Appl. No. 12/823,907, "Cell Structure for Dual-Port SRAM," filed Jun. 25, 2010, 46 pages.

Jhon Jhy Liaw, U.S. Appl. No. 12/827,406, "Rom Cell Circuit For Finfet Devices," filed Jun. 30, 2010, 32 pages.

Jhon Jhy Liaw, U.S. Appl. No. 12/823,860, "Structure And Method For SRAM Cell Circuit," filed Jun. 25, 2010, 37 pages.

Jhon Jhy Liaw, et al., U.S. Appl. No. 12/827,690, "Layout For Multiple-Fin SRAM Cell," filed Jun. 30, 2010, 35 pages.

Jeng-Jung Shen, et al., U.S. Appl. No. 12/780,060, "Automatic Layout Conversion For Finfet Device," filed May 14, 2010, 29 pages.

Jeng-Jung Shen, et al., U.S. Appl. No. 12/780,426, "Finfet Boundary Optimization," filed May 14, 2010, 28 pages.

Yu-Lien Hung, et al., U.S. Appl. No. 12/840,830, "High Surface Dopant Concentration Semiconductor Device And Method Of Fabricating," filed Jul. 21, 2010, 21 pages.

Peng-Soon Lim, et al., U.S. Appl. No. 12/827,512, "Gate Structures And Method Of Fabricating Same," filed Jun. 30, 2010, 41 pages.

Tsu-Hsiu Perng. et al., U.S. Appl. No. 12/837,093, "Fin-Like Field Effect Transistor (Finfet) Device And Method Of Manufacturing Same," filed Jul. 15, 2010. 30 pages.

Clement Hsingjen Wann, et al., U.S. Appl. No. 12/834,617, "In-Situ Spectrometry," filed Jul. 12, 2010, 20 pages.

Chia-Chung Chen, et al., U.S. Appl. No. 12/871,476, "Gate Controlled Bipolar Junction Transistor On Fin-Like Field Effect Transistor (Finfet) Structure," filed Aug. 30, 2010, 30 pages.

Jeff J. Xu, et al, U.S. Appl. No. 12/906,820, "Fin-Like Field Effect Transistor (Finfet) Device And Method of Manufacturing Same," filed Oct. 18, 2010, 55 pages.

Jeff J. CSU, et al. U.S. Appl. No. 12/917,902, "Fin-Like Field Effect Transistor (FINFET) Device And Method Of Manufacturing Same." filed Nov. 2, 2010. 61 pages.

Mark van Dai, U.S. Appl. No. 12/900,895, "Method Of Fabricating A Semiconductor Device Having An Epitaxly Region," filed Oct. 8, 2010, 21 pages.

Hsin-Chih Chen, et al, U.S. Appl. No. 12/907,272, "Multi-Fin Device By Self-Aligned Castle Fin Formation," filed Oct. 19, 2010, 34 pages.

Chien-Hsun Wangg, et al. U.S. Appl. No. 12/952,376, "Method For Adjusting Fin Width In Integrated Circuitry," filed Nov. 23, 2010, 27 pages.

Chien-Shun Wang, et al. U.S. Appl. No. 12/949,881, "Method for Forming Metrology Structures From Fins In Integrated Circuitry," filed Nov. 19, 2010, 16 pages.

Chien-Hsun Wang, et al. U.S. Appl. No. 12/953,148, "Device And Method For Forming Fins In Integrated Circuitry," filed Nov. 23, 2010, 39 pages.

* cited by examiner

METHOD FOR INCORPORATING IMPURITY ELEMENT IN EPI SILICON PROCESS

PRIORITY DATA

The present application is a continuation of U.S. application Ser. No. 12/644,869, filed Dec. 22, 2009, which is incorporated herein by reference in its entirety.

BACKGROUND

As the semiconductor industry has progressed into nanometer technology process nodes in pursuit of higher device density, higher performance, and lower costs, challenges from both fabrication and design issues have resulted in the development of three dimensional designs, such as a fin-like field effect transistor (FinFET). A typical FinFET is fabricated with a thin 'fin' extending from a substrate, for example, etched into a silicon layer of the substrate. The channel of the FET is formed in this vertical fin. A gate is provided over (e.g., wrapping) the fin. It is beneficial to have a gate on both sides of the channel allowing gate control of the channel from both sides. Further advantages of FinFETs include reducing the short channel effect and higher current flow.

There have been problems associated with fabrication of FinFETs. For example, the process of growing epitaxial (epi) silicon on portions of the fin as part of source and drain features has been adversely impacted by various process parameters of current fabrication techniques. Therefore, what is desired an improved method of growing epi silicon in semiconductor fabrication.

SUMMARY

One of the broader forms of an embodiment of the present invention involves a method of fabricating a semiconductor device. The method includes providing a substrate; forming a plurality of fins over the substrate, the fins being isolated from each other by an isolation structure; forming a gate structure over a portion of each fin; forming spacers on sidewalls of the gate structure, respectively; epitaxially (epi) growing silicon on exposed portions of each fin, wherein the epi process incorporates an impurity element selected from the group consisting of germanium (Ge), indium (In), and carbon (C); and doping the silicon epi with an n-type dopant; and doping the silicon epi with an n-type dopant.

Another one of the broader forms of an embodiment of the present invention involves a method of fabricating a semiconductor device. The method includes forming a plurality of silicon fins, the silicon fins being isolated from each other by a shallow trench isolation (STI); forming a gate structure over each of the silicon fins; forming spacers on sidewalls of the gate structure, respectively; forming an epitaxial (epi) silicon on exposed portions of each of the silicon fins; and doping the epi silicon with an n-type dopant as part of source and drain features. The epi process utilizes a silicon precursor, a carrier gas, and an impurity element selected from the group consisting of germanium (Ge), indium (In), and carbon (C). An atomic ratio of the impurity element to the epi silicon is less than 10%;

Yet another one of the broader forms of an embodiment of the present invention involves a semiconductor device. The semiconductor device includes a substrate and an n-channel finFET. The finFET includes a plurality of silicon fins disposed over the substrate, the silicon fins being isolated from each other by a shallow trench isolation (STI); a gate structure disposed over a portion of each fin; spacers formed on sidewalls of the gate structure, respectively; and source and drain regions formed in another portion of each fin including an epi silicon disposed over the another portion of each fin, wherein the epi silicon includes an impurity element selected from the group consisting of germanium (Ge), indium (In), and carbon (C), and wherein an atomic ratio of the impurity element to the epi silicon is less than 10%.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is understood that specific embodiments are provided as examples to teach the broader inventive concept, and one of ordinary skill in the art can easily apply the teaching of the present disclosure to other methods or apparatus. In addition, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings. Moreover, the formation of a first feature over and on a second feature in the description that follows may include embodiments in which the first and second features are formed in direct contact, and may also include embodiments in which additional features may be formed interposing the first and second features, such that the first and second features may not be in direct contact. FinFET device as the term is employed in the current disclosure provides any fin-based, multi-gate transistor.

Figure 1:
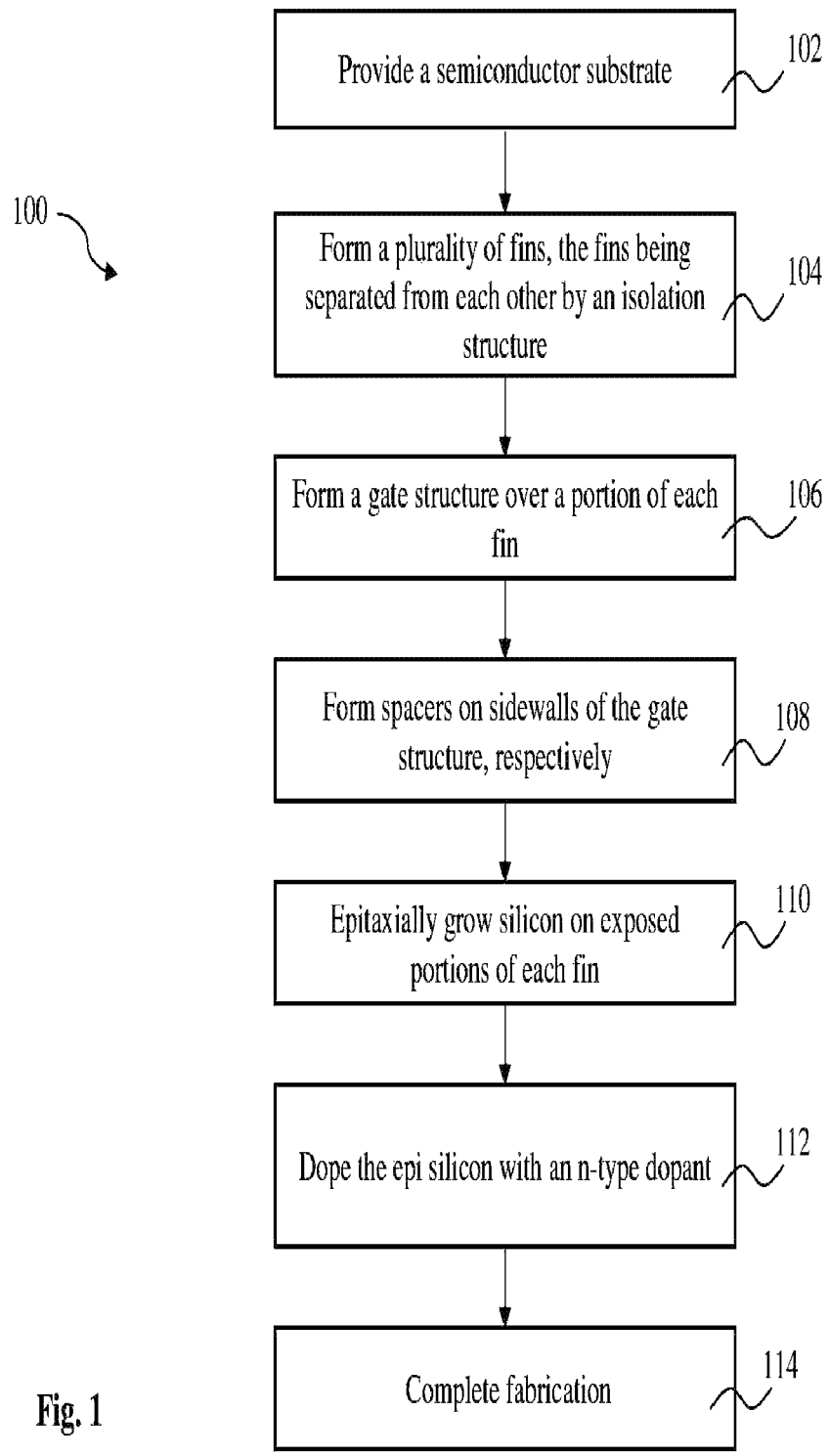
FIG. 1 is a flowchart of a method of fabricating a semiconductor device with strained structures according to various aspects of the present disclosure.

Referring to FIG. 1, illustrated is a flowchart of a method 100 of fabricating a semiconductor device according to various aspects of the present disclosure. The method 100 begins with block 102 in which a semiconductor substrate is provided. The method 100 continues with block 104 in which a plurality of fins are formed over the substrate. The fins are separated from each other by an isolation structure. The method 100 continues with block 106 in which a gate structure is formed over a portion of each fin. The method continues with block 108 in which spacers are formed on sidewalls of the gate structure, respectively. The method 100 continues with block 110 in which silicon is epitaxially (epi) grown on exposed portions of each fin. The method 100 continues with block 112 in which the silicon epi is doped with an n-type dopant to form source and drain regions. In some embodiments, the doping is performed in-situ the epi process. The method 100 continues with block 114 in which fabrication of the semiconductor device is completed. The discussion that follows illustrates various embodiment of a semiconductor device that can be fabricated according to the method 100 of FIG. 1.

Figure 2A:
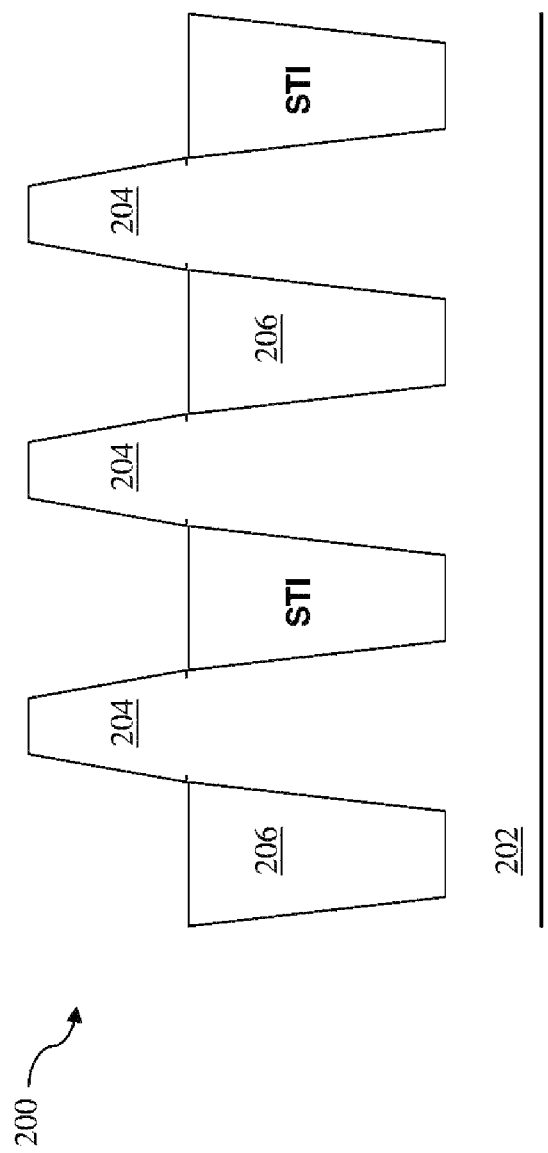
FIGS. 2A-2G are cross-sectional views and a top view of a semiconductor device at various stages of fabrication according to the method of FIG. 1.

Referring to FIGS. 2A-2G, illustrated is an embodiment of a semiconductor device 200 at various stages of fabrication according to the method 100 of FIG. 1. It should be noted that the semiconductor device 200 may be fabricated in CMOS technology. Accordingly, additional processes may be provided before, during, and after the method 100 of FIG. 1, and that some process are only briefly described herein. It is understood that FIGS. 2A-2G have been simplified for the sake of clarity to better understand the inventive concepts of the present disclosure. In FIG. 2A, the semiconductor device 200 includes a substrate 202. The substrate 202 may be silicon in a crystalline structure. In other embodiments, the substrate may include other elementary semiconductors such as germanium, or include a compound semiconductor such as, silicon carbide, gallium arsenide, indium arsenide, and indium phosphide.

The semiconductor device 200 includes a plurality of fins 204 that extend from the substrate 202. Although only three fins are shown, it is understood that the number of fins may vary depending on the particular application. The fins 204 include silicon. The fins 204 may be fabricated by using suitable process such as photolithography and etch. For example, the photolithography process may include forming a photoresist layer (resist) overlying the substrate (e.g., on a silicon layer), exposing the resist to a pattern, performing post-exposure bake processes, and developing the resist to form a masking element including the resist. The masking element may then be used to etch fins 204 from the substrate 202. The fins 204 may be etched using reactive ion etch (RIE) and/or other suitable processes. Shallow trench isolation (STI) structures 206 surround the fins 204 and isolate each fin from the other fins. The STI structures 206 may include any suitable insulating material.

In other embodiments, the substrate 202 includes a silicon-on-insulator (SOI) substrate. The SOI substrate may be fabricated using separation by implantation of oxygen (SIMOX), wafer bonding, and/or other suitable methods. The layer of silicon may be a silicon layer of an SOI substrate (e.g., overlying an insulator layer). The fins may be formed, for example, by etching a layer of silicon on the substrate 202.

In an embodiment, the fins 204 may be formed by double-patterning lithography (DPL) process. DPL is a method of constructing a pattern on a substrate by dividing the pattern into two interleaved patterns. DPL allows enhanced feature (e.g., fin) density. Various DPL methodologies may used including, double exposure (e.g., using two mask sets), forming spacers adjacent features and removing the features to provide a pattern of spacers, resist freezing, and/or other suitable processes.

Figure 2B:
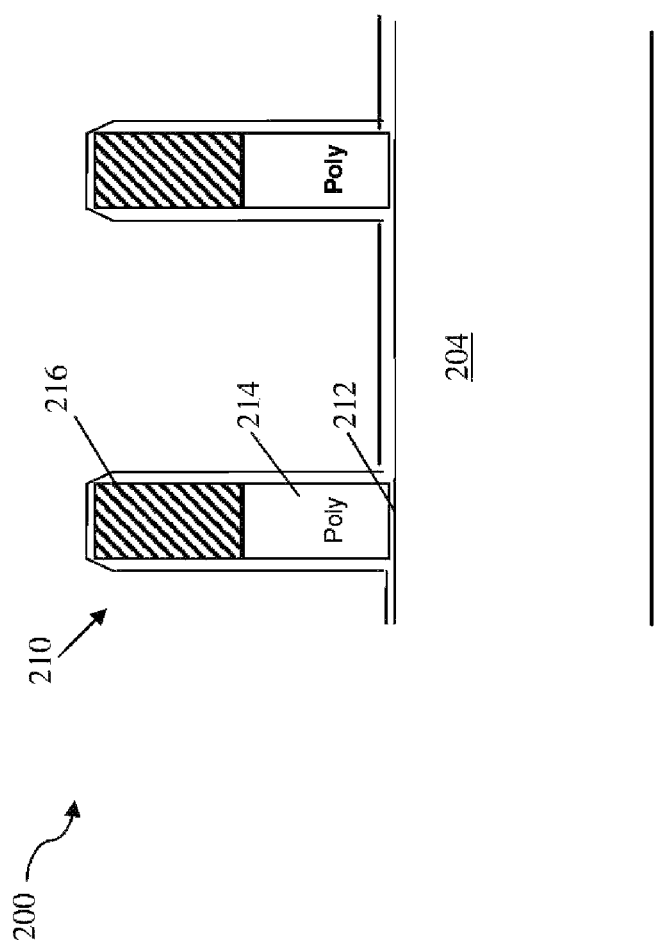
Figure 2C:
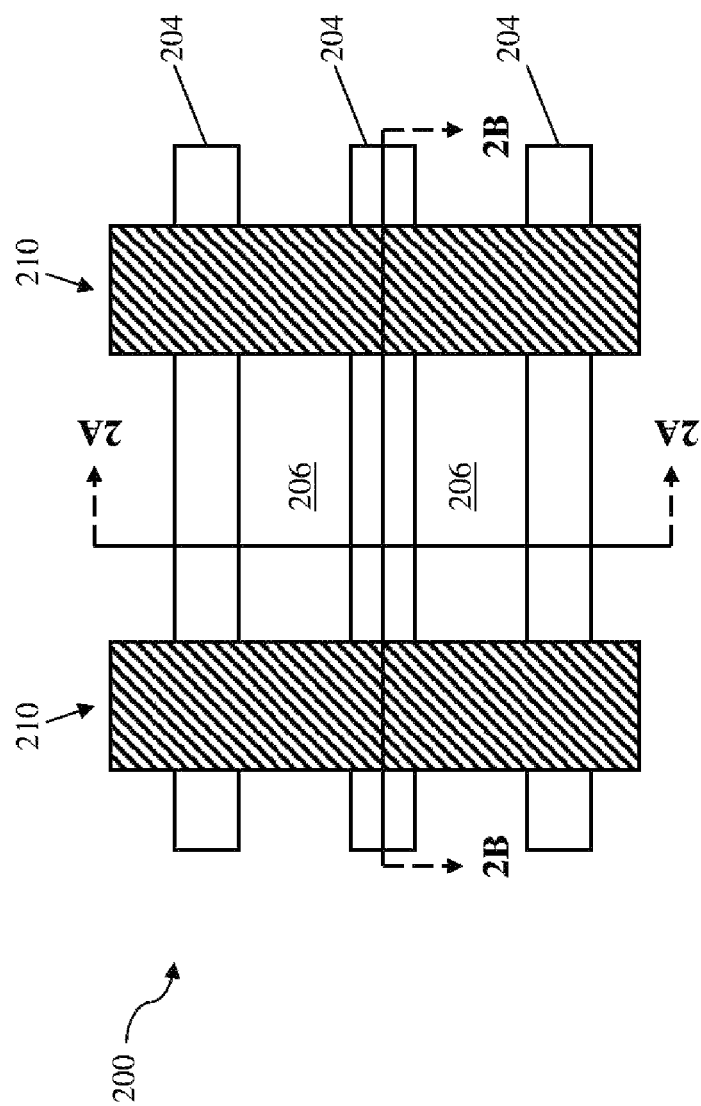

In FIG. 2B, the semiconductor device 200 includes one or more gate structures 210 that are formed over a portion of each of the fins 204. It is noted that FIG. 2A is a cross-sectional view across the fins 204 and FIG. 2B is a cross-sectional view along one of the fins 204 as is shown by a top view in FIG. 2C. Although not shown, the gate structures 210 wrap around the fins 204 allowing gate control of the channel from both sides of the fin. The gate structure 210 includes a gate dielectric layer 212, a gate electrode 214, and a hard mask 216.

The gate dielectric 212 may include silicon oxide, silicon nitride, high-k dielectric, or other suitable material. The high-k dielectric layer may include a binary or ternary high-k film such as HfOx. Alternatively, the high-k dielectric layer 212 may optionally include other high-k dielectrics such as LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfSiO, (Ba,Sr)TiO3 (BST), Al2O3, Si3N4, oxynitrides, or other suitable materials. The gate dielectric is formed by a suitable process such as an atomic layer deposition (ALD), chemical vapor deposition (CVD), physical vapor deposition (PVD), thermal oxidation, UV-ozone oxidation, or combinations thereof.

The gate electrode 214 may include polysilicon, silicon-germanium, a metal including metal compounds such as, Mo, Cu, W, Ti, Ta, TiN, TaN, NiSi, CoSi, and/or other suitable conductive materials known in the art. The gate electrode 214 may be formed using processes such as, physical vapor deposition (PVD), chemical vapor deposition (CVD), plasma-enhanced chemical vapor deposition (PECVD), atmospheric pressure chemical vapor deposition (APCVD), low-pressure CVD (LPCVD), high density plasma CVD (HD CVD), atomic layer CVD (ALCVD), and/or other suitable processes which may be followed, for example, by photolithography and/or etching processes.

The hard mask 216 includes silicon oxide. Alternatively, the hard mask 216 may optionally silicon nitride, silicon oxynitride, and/or other suitable dielectric materials, and may be formed using a method such as CVD or PVD.

Figure 2D:
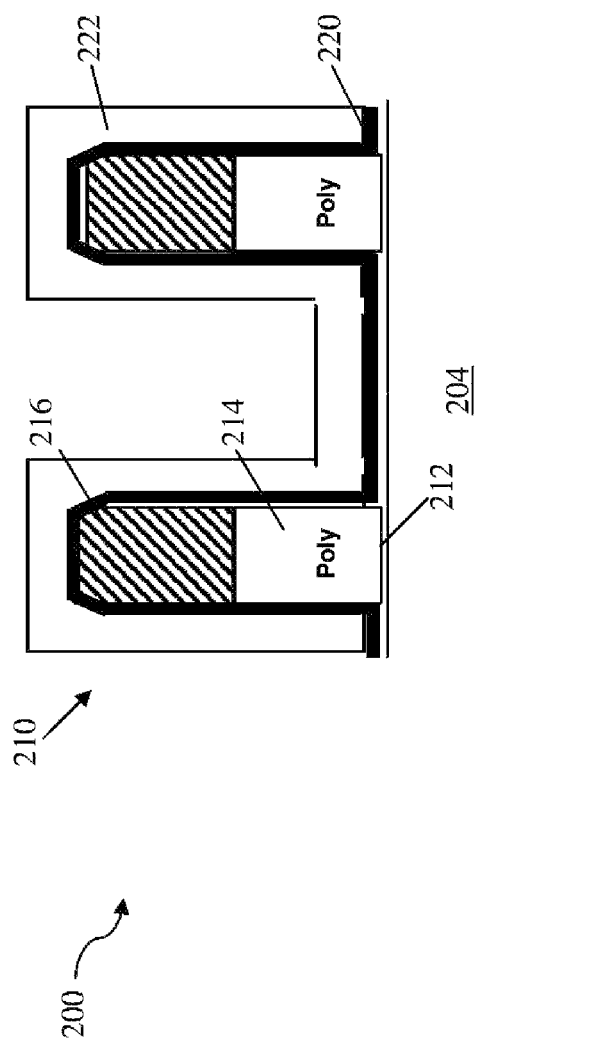

In FIG. 2D, spacer material layers are formed over the gate structures 210 and the fins 204. For example, an oxide layer 220 may be formed over the substrate the gate structures 210. The oxide layer 220 may be formed by CVD, PVD, ALD, or other suitable technique. Additionally, a nitride layer 222 may be formed over the oxide layer 220. The nitride layer 222 may be formed by CVD, PVD, ALD, or other suitable technique.

Figure 2E:
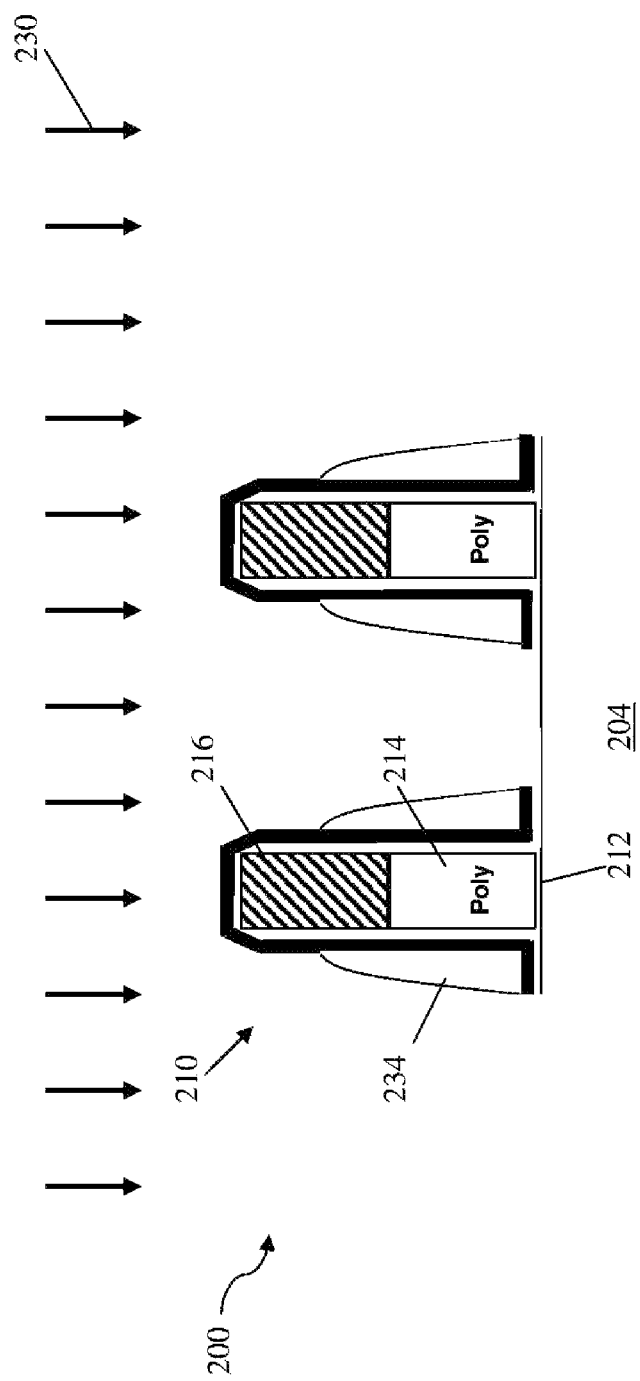

In FIG. 2E, an etching process 230 is performed to remove portions of the nitride layer 222 and oxide layer 220 thereby forming spacers 234. In the present embodiment, the etching process 230 includes a dry etching (e.g., anisotropic etching) process. Therefore, following the etching process 230, spacers 234 are formed on the sidewalls of the gate structures 210. It is understood that the etching process 230 may be performed as one etching process or multiple etching processes. A cleaning process such as an HF cleaning process may be performed after the etching process 230. In some embodiments, an implantation process may be performed to implant dopants in exposed portions of the fins 204 to form source and drain features.

Figure 2F:
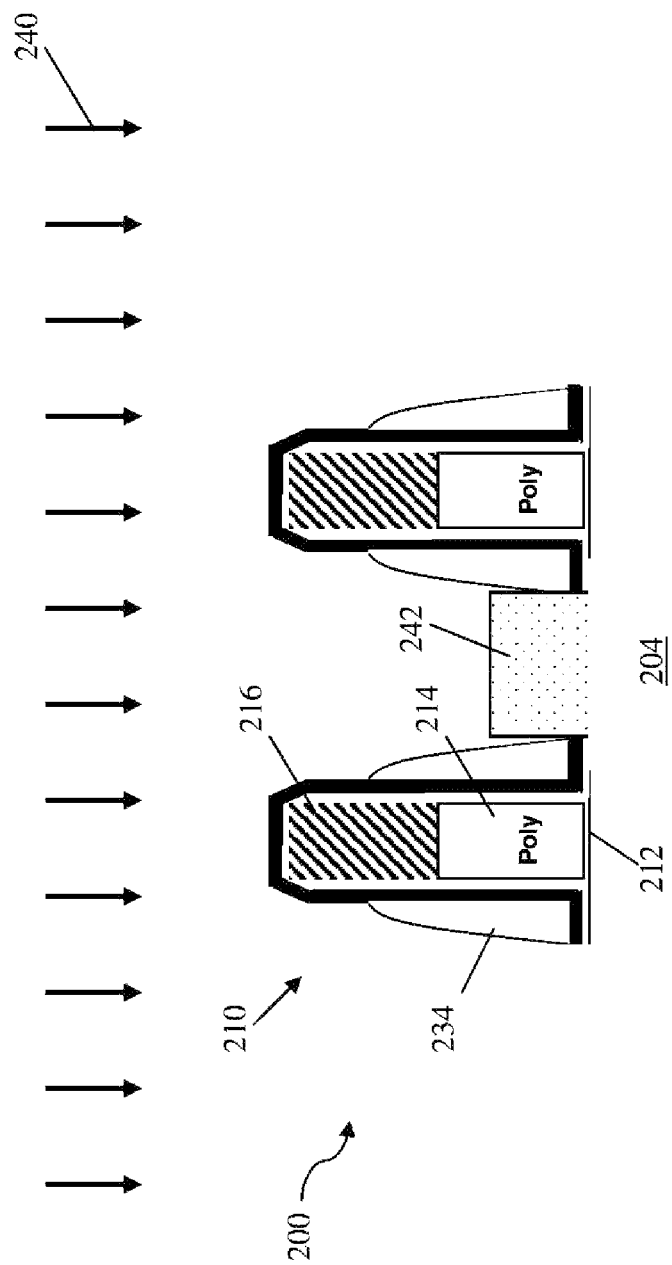
Figure 2G:
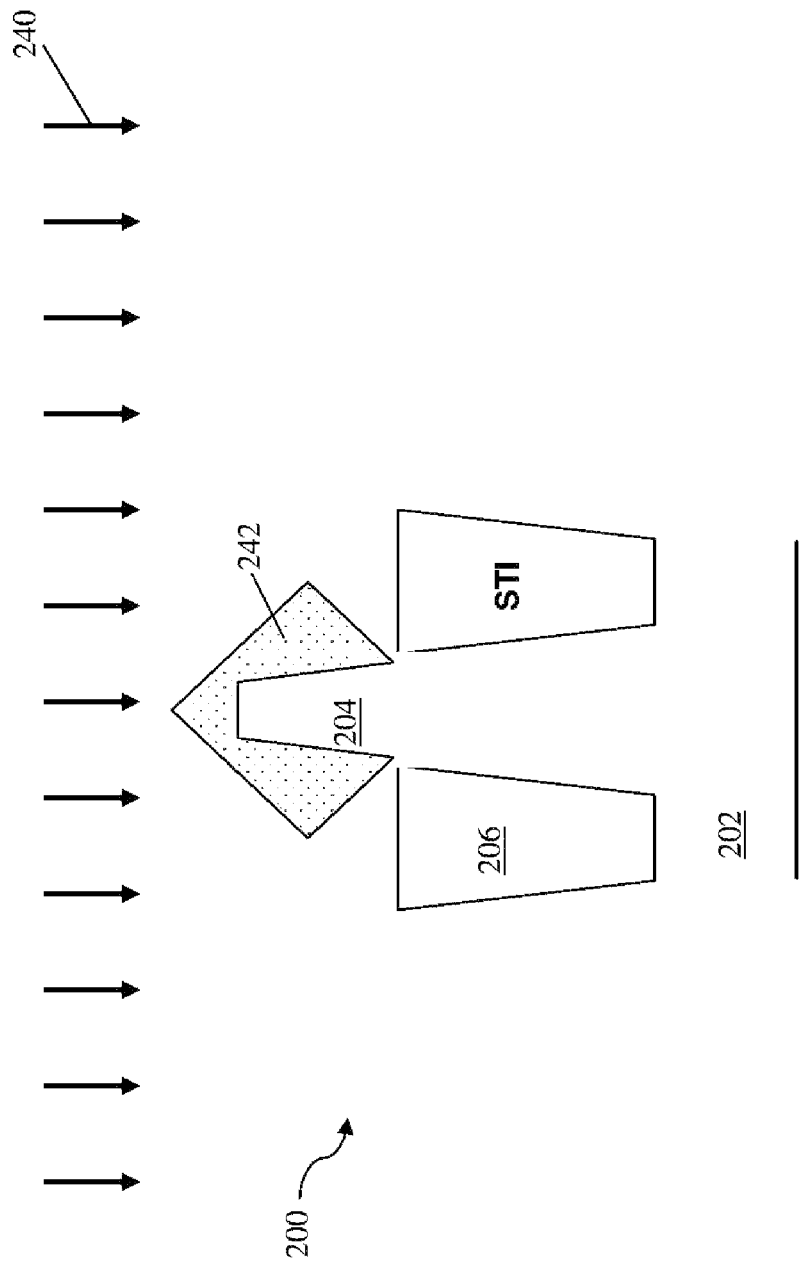

In FIGS. 2F and 2G, an epitaxial (epi) process 240 is performed to selectively grow silicon 242 on exposed portions of the fins 204 as part of source and drain features of an n-channel finFET device. It is noted that FIG. 2F is cross-sectional view along one of the fins 204 (similar to FIG. 2B) and FIG. 2G is a cross-sectional view across the fins 204 (similar to FIG. 2A). The epi silicon 242 provides raised source and drain features, and helps reduce parasitic series resistance which improves device performance such as drive current. The epi process 240 utilizes a silicon precursor such as SiH4, Si2H2Cl2, or Si3H8, a carrier gas such as H2 or N2, and an etchant component such as HCl.

The etchant component is used to control deposition selectivity of the silicon. That is, there may be some silicon that is undesirably deposited on other materials besides silicon, such as the STI 206 (e.g., oxide) and the spacers 234 (e.g., nitride). Accordingly, the etchant component is used to remove the silicon on these structures. It has been observed that the etchant component adversely impacts the growth rate of the epi silicon. The amount of etchant component is selected in view of a trade-off between the growth rate and the deposition selectivity. Further, in situations where doping (e.g., n-type dopant such as phosphorous (P) or arsenic (A)) is performed in-situ the epi process, it has been observed that the etchant component adversely impacts the doping concentration. The dopant precursor flow (e.g., PH3 flow for phosphorous) can be increased to increase the doping concentration. However, the doping concentration becomes saturated at a certain dopant precursor flow, and thus increasing the dopant precursor flow beyond this point will have no effect. Moreover, it has been observed that defects in the epi silicon may form due to the low selectivity at the STI 206.

In the present embodiment, an impurity element is incorporated with the epi process 240 to address the various issues discussed above. The impurity element includes germanium (G), indium (In), and carbon (C). For example, GeH4 may be utilized for the Ge impurity element. Indium acetylacetonate (In(OCCH3CHOCCH3)3) or trimethylindium (In(CH3)3) may be utilized for the In impurity element. CH3SiH3 may be utilized for the C impurity element. An amount of the impurity element is selected so as not to adversely affect the structure of the epi silicon 242. In the present embodiment, a percentage of the impurity element is selected to be less than 10%, and in some instances less than 5%. The percentage is calculated based on an atomic ratio of the impurity element to the epi silicon. The atomic ratio is the number of impurity element atoms to the number of epi silicon atoms. Accordingly, some impurity elements may remain in the epi silicon 242 after the epi process 240.

The epi process 240 utilizes a total pressure ranging from about 5 to about 350 torr and a process temperature ranging from about 550° C. to about 750° C. The carrier gas flow ranges from about 10 slm to about 45 slm. It is noted that the specified ranges for the various process parameters have been found to provide a suitable growth rate and defect-free epi silicon. However, it is understood that the various process parameters may be tuned for a particular fabrication tool and/or application.

It has been observed that by incorporating the impurity element, the growth rate of the epi process is improved. One reason may be that the impurity element acts as a desorption center for the hydrogen atoms of the silicon precursor on the surface. Additionally, in situations where doping is performed in-situ the epi process, the dopant precursor flow can be increased to increase the doping concentration to a desired level without concern of saturation. The impurity element may reduce dopant poison on the silicon surface. Thus, in-situ doping is a viable option with the incorporation of the impurity element. In some embodiment, a percentage of the dopant element is less than 1%. The percentage is calculated based on an atomic ratio of the impurity element to the epi silicon. The atomic ratio is the number of impurity element atoms to the number of epi silicon atoms. Accordingly, some impurity elements may remain in the epi silicon 242 after the epi process 240. Moreover, it has been observed that defects in the epi silicon are reduced due to good selectivity at the STI 206 with the incorporation of the impurity element.

The semiconductor device 200 may continue with fabricating other features of FinFET elements as is known in the art, including, for example, forming of source/drain regions, forming contact such as silicide features, interconnect structures, and/or other suitable processes and features as is known in the art.

The semiconductor device 200 serves only as one example. The semiconductor device 200 may be used in various applications such as digital circuit, microprocessors, imaging sensor devices, dynamic random access memory (DRAM) cell, and/or other microelectronic devices (collectively referred to herein as microelectronic devices). Of course, aspects of the present disclosure are also applicable and/or readily adaptable to other types of transistors, including single-gate transistors, planar transistors, double-gate transistors, and other multiple-gate transistors, and may be employed in many different applications, including sensor cells, memory cells, logic cells, and others.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
    forming a fin structure over a substrate, the fin structure having a first sidewall portion and an opposing second sidewall portion and a top surface extending between the first and second sidewall portions;
    forming a gate structure along the first sidewall portion, the second sidewall portion, and the top surface of the fin structure such that the gate structure physically contacts the first sidewall portion, the second sidewall portion, and the top surface of the fin structure;
    forming a spacer layer directly on a top surface of the gate structure; and
    epitaxially growing silicon on an exposed portion the fin structure to form a source/drain feature, wherein the spacer layer covers the top surface of the gate structure while the silicon is epitaxially grown on the exposed portion of the fin structure.

2. The method of claim 1, wherein epitaxially growing silicon on the exposed portion the fin structure to form the source/drain feature includes incorporating an impurity element into the source/drain feature.

3. The method of claim 2, wherein the impurity element includes an element selected from the group consisting of germanium, indium, and carbon.

4. The method of claim 2, wherein the impurity element includes indium.

5. The method of claim 1, wherein forming the fin structure over the substrate includes removing portions of the substrate to form the fin structure.

6. The method of claim 1, wherein the substrate includes silicon, and
    wherein the spacer layer includes an oxide material.

7. The method of claim 1, wherein the gate structure includes a high-k dielectric layer and a metal gate electrode.

8. A method comprising:
    forming a fin structure over a substrate, the fin structure having a first sidewall portion and an opposing second sidewall portion and a top surface extending between the first and second sidewall portions;
    forming a dielectric isolation structure in the substrate adjacent the fin structure;
    forming a gate structure directly on the first sidewall portion, the second sidewall portion, and the top surface of the fin structure;
    forming a dielectric material layer directly on a top surface of the gate structure and directly on a sidewall surface of the gate structure; and forming a source/drain feature on an exposed portion of the fin structure while the dielectric material layer is disposed directly on the top surface and the sidewall surface of the gate structure.

9. The method of claim 8, wherein forming the source/drain feature includes growing an epitaxial material on the exposed portion of the fin structure.

10. The method of claim 9, wherein growing the epitaxial material on the exposed portion of the fin structure includes incorporating an element into the epitaxial material, the element selected from the group consisting of germanium, indium, and carbon.

11. The method of claim 8, further comprising forming another dielectric material layer over the dielectric material layer prior to forming the source/drain feature on the exposed portion of the fin structure.

12. The method of claim 11, further comprising removing a portion of the another dielectric material layer to expose the dielectric material layer prior to forming the source/drain feature on the exposed portion of the fin structure.

13. The method of claim 8, wherein forming the fin structure over the substrate includes removing a portion of the substrate to form the fin structure such that a recess is formed in the substrate adjacent the fin structure, and wherein forming the dielectric isolation structure in the substrate adjacent the fin structure includes forming the dielectric isolation structure in the recess.

14. The method of claim 8, further comprising forming another fin structure over the substrate, wherein the dielectric isolation structure extends between the fin structure and the another fin structure.

15. A device comprising:
a silicon fin structure disposed over a semiconductor substrate, the silicon fin structure having a first sidewall portion and an opposing second sidewall portion and a top surface extending between the first and second sidewall portions
a gate structure disposed directly on the first sidewall portion, the second sidewall portion, and the top surface of the silicon fin structure;
a first dielectric material layer disposed directly on a top surface of the gate structure and directly on a sidewall surface of the gate structure; and
an epitaxially grown source/drain feature disposed on the silicon fin structure, the epitaxially grown source/drain feature including silicon and an impurity element, the impurity element selected from the group consisting of germanium, indium, and carbon, wherein an atomic ratio of the impurity element to silicon in the epitaxially grown source/drain feature is less than 10%.

16. The device of claim 15, wherein the epitaxially grown source/drain feature is an n-type source/drain feature.

17. The device of claim 15, further comprising a second dielectric material layer disposed on the first dielectric material layer over the sidewall surface of the gate structure.

18. The device of claim 17, wherein the epitaxially grown source/drain feature physically contacts the second dielectric material layer.

19. The device of claim 15, wherein the atomic ratio of the impurity element to silicon in the epitaxially grown source/drain feature is less than 1%.

20. The device of claim 15, further comprising a shallow trench isolation structure disposed in the semiconductor substrate adjacent the silicon fin structure.

* * * * *